(12) United States Patent
Greinke et al.

(10) Patent No.: US 6,746,768 B2
(45) Date of Patent: Jun. 8, 2004

(54) THERMAL INTERFACE MATERIAL

(75) Inventors: Ronald A. Greinke, Medina, OH (US); Daniel W. Krassowski, Columbia Township, OH (US)

(73) Assignee: Advanced Energy Technology Inc., Wilmington, DE (US)

( * ) Notice: Subject to any disclaimer, the term of this patent is extended or adjusted under 35 U.S.C. 154(b) by 30 days.

(21) Appl. No.: 10/027,207

(22) Filed: Dec. 26, 2001

(65) Prior Publication Data

US 2003/0118826 A1 Jun. 26, 2003

(51) Int. Cl.[7] .................................................. B32B 9/00
(52) U.S. Cl. ...................... 428/408; 428/447; 428/497; 361/708; 361/709; 423/448; 165/185; 165/905; 165/907
(58) Field of Search ................................ 428/408, 447, 428/497, 499; 361/708, 709; 423/414, 445 R, 448; 165/185, 905, 907

(56) References Cited

U.S. PATENT DOCUMENTS

| 3,404,061 A | | 10/1968 | Shane et al. |
| 4,162,078 A | * | 7/1979 | Cox |
| 4,256,806 A | * | 3/1981 | Snyder |
| 4,895,713 A | | 1/1990 | Greinke et al. |
| 5,902,762 A | | 5/1999 | Mercuri et al. |
| 6,017,857 A | * | 1/2000 | Heimann et al. |
| 6,245,400 B1 | | 6/2001 | Tzeng et al. |
| 6,616,999 B1 | * | 9/2003 | Freuler et al. ............. 428/40.1 |

FOREIGN PATENT DOCUMENTS

| CN | 1275592 | * | 12/2000 |
| KR | 9406238 | * | 7/1994 |
| WO | WO200020525 A1 | | 4/2000 |

OTHER PUBLICATIONS

IBM Corporation, "Advance Information PowerPC", Feb. 23, 1999 Rev. 2.0.

* cited by examiner

*Primary Examiner*—Deborah Jones
*Assistant Examiner*—Wendy Boss
(74) *Attorney, Agent, or Firm*—Waddey & Patterson; James R. Cartiglia

(57) ABSTRACT

A thermal interface and a thermal interface as part of a thermal management system that comprises a heat source, and a cooling module. The heat source has an external surface; the thermal interface is a flexible graphite sheet article having two parallel planar surfaces, with the first planar surface of the thermal interface being in operative contact with the external surface of the heat source and the second planar surface being in contact with the cooling module. The graphite sheet contains oil.

26 Claims, 2 Drawing Sheets

THERMAL INTERFACE MATERIAL

TECHNICAL FIELD

The present invention relates to a system for managing the heat from a heat source like an electronic component. More particularly, the present invention relates to a system effective for dissipating the heat generated by an electronic component. Additionally, the present invention relates to a thermal interface sheet article used in conjunction with the heat management system of an electronic component.

BACKGROUND OF THE ART

With the development of more sophisticated electronic components, including those capable of increasing processing speeds and higher frequencies, having smaller size and more complicated power requirements, and exhibiting other technological advances, such as microprocessors and integrated circuits in electronic and electrical components and systems as well as in other devices such as high power optical devices, relatively extreme temperatures can be generated. However, microprocessors, integrated circuits and other sophisticated electronic components typically operate efficiently only under a certain range of threshold temperatures. The excessive heat generated during operation of these components can not only harm their own performance, but can also degrade the performance and reliability of the overall system and can even cause system failure. The increasingly wide range of environmental conditions, including temperature extremes, in which electronic systems are expected to operate, exacerbates these negative effects.

With the increased need for heat dissipation from microelectronic devices caused by these conditions, thermal management becomes an increasingly important element of the design of electronic products. As noted, both performance reliability and life expectancy of electronic equipment are inversely related to the component temperature of the equipment.

For instance, a reduction in the operating temperature of a device such as a typical SD silicon semiconductor can correspond to an exponential increase in the reliability and life expectancy of the device. Therefore, to maximize the life-span and reliability of a component, controlling the device operating temperature within the limits set by the designers is of paramount importance. A thermal management system is designed to assist with this objective.

One element of a thermal management system is a thermal interface material. A typical use for a thermal interface material is to thermally connect a computer chip to a cooling module (i.e., a heat sink as discussed above) to overcome contact resistance and lack of surface conformity between the heat sink, or the cooling module and the chip or other heat source. Typically, thermal interfaces consist of thermal greases, phase change materials and tapes. Flexible graphite is readily applicable to such applications because of its low thermal resistance and its ability to conform to the surfaces to be interfaced, especially when either or both surfaces are not completely flat. Such characteristics are important in a thermal management system because reducing the thermal resistance as much as possible is of paramount importance.

Although discussed in greater detail below, the process for manufacturing the flexible graphite used in the thermal interface is well-known and the typical practice is described in U.S. Pat. No. 3,404,061 to Shane et al., the disclosure of which is incorporated herein by reference. In general, flakes of natural graphite are intercalated in an acid solution. After the flakes are intercalated they are washed and dried and then exfoliated by exposure to a high temperature for a short period of time. This causes the flakes to expand or exfoliate in a direction perpendicular to the crystalline planes of the graphite. The exfoliated graphite flakes are vermiform in appearance and are therefore commonly referred to as worms. The worms may be compressed into sheets or foils with a density approaching theoretical density although a density of about 1.1 g/cc is considered typical for most applications. The sheets of flexible graphite can be cut into any desired configuration to suit a particular application.

Graphites are made up of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as graphene layers or basal planes, are linked or bonded together and groups thereof are arranged in crystallites. Highly ordered graphites consist of crystallites of considerable size: the crystallites being highly aligned or oriented with respect to each other and having well ordered carbon layers. In other words, highly ordered graphites have a high degree of preferred crystallite orientation. It should be noted that graphites possess anisotropic structures and thus exhibit or possess many properties that are highly directional such as thermal and electrical conductivity.

Briefly, graphites may be characterized as laminated structures of carbon, that is, structures consisting of superposed layers or laminae of carbon atoms joined together by weak van der Waals forces. In considering the graphite structure, two axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers or the directions perpendicular to the "c" direction. The graphites suitable for manufacturing flexible graphite sheet, typically natural graphite flake, possess a very high degree of orientation.

As noted above, the bonding forces holding the parallel layers of carbon atoms together are only weak van der Waals forces. Natural graphites can be treated so that the spacing between the superposed carbon layers or laminae can be appreciably opened up so as to provide a marked expansion in the direction perpendicular to the layers, that is, in the "c" direction, and thus form an expanded or intumesced graphite structure in which the laminar character of the carbon layers is substantially retained.

Graphite flake which has been greatly expanded and more particularly expanded so as to have a final thickness or "c" direction dimension which is as much as about 80 or more times the original "c" direction dimension can be formed without the use of a binder into cohesive or integrated sheets of expanded graphite, e.g. webs, papers, strips, tapes, foils, mats or the like (typically referred to as "flexible graphite"). The formation of graphite particles which have been expanded to have a final thickness or "c" dimension which is as much as about 80 times or more the original "c" direction dimension into integrated flexible sheets by compression, without the use of any binding material, is believed to be possible due to the mechanical interlocking, or cohesion, which is achieved between the voluminously expanded graphite particles.

In addition to flexibility, the sheet material, as noted above, has also been found to possess a high degree of anisotropy with respect to thermal and electrical conductivity due to orientation of the expanded graphite particles and graphite layers substantially parallel to the opposed faces of the sheet resulting from very high compression, e.g. roll pressing. Sheet material thus produced has excellent flexibility, good strength and a very high degree of orientation.

Briefly, the process of producing flexible, binderless anisotropic graphite sheet material, e.g. web, paper, strip, tape, foil, mat, or the like, comprises compressing or compacting under a predetermined load and in the absence of a binder, expanded graphite particles which have a "c" direction dimension which is as much as about 80 or more times that of the original particles so as to form a substantially flat, flexible, integrated graphite sheet. The expanded graphite particles that generally are worm-like or vermiform in appearance, once compressed, will maintain the compression set and alignment with the opposed major surfaces of the sheet. The density and thickness of the sheet material can be varied by controlling the degree of compression. The density of the sheet material can be within the range of from about 0.04 g/cc to about 2.0 g/cc. The flexible graphite sheet material exhibits an appreciable degree of anisotropy due to the alignment of graphite particles parallel to the major opposed, parallel surfaces of the sheet, with the degree of anisotropy increasing upon roll pressing of the sheet material to increase orientation. In roll pressed anisotropic sheet material, the thickness, i.e. the direction perpendicular to the opposed, parallel sheet surfaces comprises the "c" direction and the directions ranging along the length and width, i.e. along or parallel to the opposed, major surfaces comprises the "a" directions and the thermal and electrical properties of the sheet are very different, by orders of magnitude, for the "c" and "a" directions.

U.S. Pat. No. 6,245,400 to Tzeng et al. discloses a release lined pressure sensitive adhesive flexible graphite sheet article that has low thermal resistance properties. The flexible graphite sheet comprises a flexible graphite substrate, and adhesive primer coating thereon, a pressure sensitive adhesive coating on the adhesive primer coating and a release liner applied to the pressure sensitive adhesive coating.

SUMMARY OF THE INVENTION

An object of the present invention is to improve the conduction of heat between a heat source and a cooling module.

Another object of the present invention is to provide a thermal interface that has reduced contact resistance and increased thermal conductivity with respect to the heat dissipating component and the heat source.

More specifically, an embodiment of the present invention is a thermal interface material that comprises a flexible graphite sheet article, the sheet article containing oil.

Another embodiment of the present invention is a thermal management system that comprises a heat source having an external surface; a thermal interface which comprises a flexible graphite sheet article that contains oil, the thermal interface being in operative communication with the external surface of the heat source; and a heat dissipating component having a heat collection surface and a heat dissipation surface, the heat collection surface being in operative communication with the thermal interface. In this embodiment, arranging the heat collection surface in operative connection with the thermal interface causes dissipation of heat from the heat source.

Another embodiment of the present invention is a thermal management system that comprises a heat source that comprises an electronic component, a thermal interface, and a heat sink. In this embodiment, the heat source has an external surface; the thermal interface comprises a flexible graphite sheet article having two parallel planar surfaces extending in a direction parallel to the planar direction of the crystal structure of the graphite in the sheet, a first of the planar surfaces of the thermal interface being in operative contact with the external surface of the heat source. Furthermore, the graphite sheet preferably contains at least 2% by weight of oil. In this embodiment, the planar area of the first planar surface of the thermal interface is greater than the area of the external surface of the heat source. Finally, the heat sink has a heat collection surface and at least one heat dissipation surface. The heat collection surface of the heat sink is in operative contact with the second of the planar surfaces of the thermal interface.

Another embodiment of the present invention is a process for preparing a thermal interface material. The process comprises providing a flexible graphite sheet material that has two parallel planar surfaces extending in a direction parallel to the planar direction of the crystal structure of the graphite in the sheet, and providing oil; and contacting said oil with the graphite sheet until from about 2% to about 75% by weight of the oil is absorbed into the thermal interface material.

Finally, another embodiment of the present invention is a method of dissipating heat from a heat source comprising using the thermal interface materials and the thermal management systems of the present invention.

Preferably in the above embodiments, the thermal interface comprises an anisotropic flexible graphite sheet having a planar area greater than the area of the external surface of the heat source. Furthermore, preferably in the above embodiments, the oil is mineral oil.

Other and further objects, features, and advantages of the present invention will be readily apparent to those skilled in the art, upon a reading of the following disclosure when taken in conjunction with the accompanying drawings.

BRIEF DESCRIPTION OF THE DRAWINGS

The present invention will be better understood and its advantages more apparent in view of the following detailed description, especially when read with reference to the appended drawings.

DETAILED DESCRIPTION OF THE INVENTION

Figure 1:
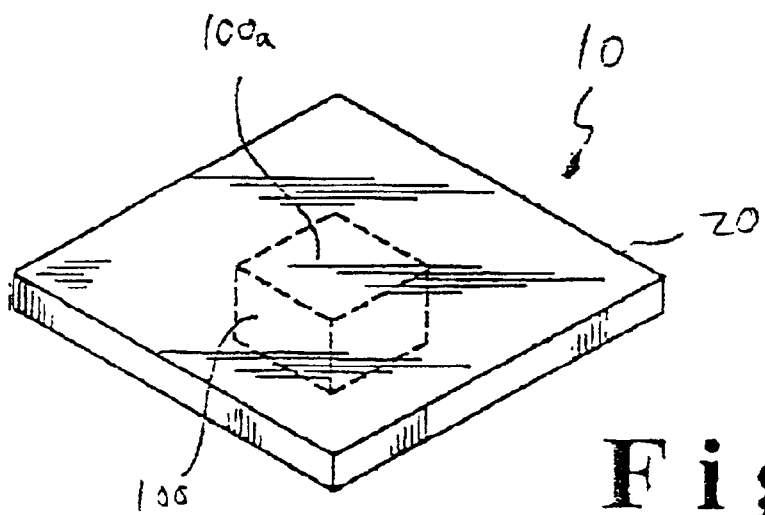
FIG. 1 is a top perspective view of one embodiment of a thermal management system in accordance with the present invention, showing a heat source in phantom.

As stated above, an embodiment of the present invention is providing a thermal interface material that may be used in conjunction with a thermal management system. The thermal interface material is a flexible graphite sheet article that contains oil.

Graphite is a crystalline form of carbon comprising atoms covalently bonded in flat layered planes with weaker bonds between the planes. In obtaining source materials such as the above flexible sheets of graphite, particles of graphite, such as natural graphite flake, are typically treated with an intercalant of, e.g. a solution of sulfuric and nitric acid, the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion-like fashion in the "c" direction, i.e. in the direction perpendicular to the crystalline planes of the graphite. The exfoliated graphite particles are vermiform in appearance, and are therefore commonly referred to as worms. The worms may be compressed together into flexible sheets that, unlike the original graphite flakes, can be formed and cut into various shapes and provided with small transverse openings by deforming mechanical impact.

Graphite starting materials for the flexible sheets suitable for use in the present invention include highly graphitic carbonaceous materials capable of intercalating organic and inorganic acids as well as halogens and then expanding when exposed to heat. These highly graphitic carbonaceous materials most preferably have a degree of graphitization of about 1.0. As used in this disclosure, the term "degree of graphitization" refers to the value g according to the formula:

$$g = 3.45 - d(002)/0.095$$

where d(002) is the spacing between the graphitic layers of the carbons in the crystal structure measured in Angstrom units. The spacing d between graphite layers is measured by standard X-ray diffraction techniques. The positions of diffraction peaks corresponding to the (002), (004) and (006) Miller Indices are measured, and standard least-squares techniques are employed to derive spacing which minimizes the total error for all of these peaks. Examples of highly graphitic carbonaceous materials include natural graphites from various sources, as well as other carbonaceous materials such as carbons prepared by chemical vapor deposition and the like. Natural graphite is most preferred.

The graphite starting materials for the flexible sheets used in the present invention may contain non-carbon components so long as the crystal structure of the starting materials maintains the required degree of graphitization and they are capable of exfoliation. Generally, any carbon-containing material, the crystal structure of which possesses the required degree of graphitization and which can be exfoliated, is suitable for use with the present invention. Such graphite preferably has an ash content of less than twenty weight percent. More preferably, the graphite employed for the present invention will have a purity of at least about 94%. In the most preferred embodiment, the graphite employed will have a purity of at least about 98%.

A common method for manufacturing graphite sheet is described by Shane et al. in U.S. Pat. No. 3,404,061, the disclosure of which is incorporated herein by reference. In the typical practice of the Shane et al. method, natural graphite flakes are intercalated by dispersing the flakes in a solution containing e.g., a mixture of nitric and sulfuric acid, advantageously at a level of about 20 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

In a preferred embodiment, the intercalating agent is a solution of a mixture of sulfuric acid, or sulfuric acid and phosphoric acid, and an oxidizing agent, i.e. nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

The quantity of intercalation solution may range from about 20 to about 150 pph and more typically about 50 to about 120 pph. After the flakes are intercalated, any excess solution is drained from the flakes and the flakes are water-washed.

Alternatively, the quantity of the intercalation solution may be limited to between about 10 and about 50 pph, which permits the washing step to be eliminated as taught and described in U.S. Pat. No. 4,895,713, the disclosure of which is also herein incorporated by reference.

The particles of graphite flake treated with intercalation solution can optionally be contacted, e.g. by blending, with a reducing organic agent selected from alcohols, sugars, aldehydes and esters which are reactive with the surface film of oxidizing intercalating solution at temperatures in the range of 25° C. and 125° C. The organic reducing agent increases the expanded volume (also referred to as "worm volume") upon exfoliation and is referred to as an expansion aid. Suitable specific organic agents include hexadecanol, octadecanol, 1-octanol, 2-octanol, decylalcohol, 1, 10 decanediol, decylaldehyde, 1-propanol, 1,3 propanediol, ethyleneglycol, polypropylene glycol, dextrose, fructose, lactose, sucrose, potato starch, ethylene glycol monostearate, diethylene glycol dibenzoate, propylene glycol monostearate, glycerol monostearate, dimethyl oxylate, diethyl oxylate, methyl formate, ethyl formate, ascorbic acid and lignin-derived compounds, such as sodium lignosulfate. The amount of organic reducing agent is suitably from about 0.5 to 4% by weight of the particles of graphite flake.

Another class of expansion aids that can be added to the intercalating solution, or to the graphite flake prior to intercalation, and work synergistically with the above-described organic reducing agents are carboxylic acids. An expansion aid in this context will advantageously be sufficiently soluble in the intercalation solution to achieve an improvement in expansion. More narrowly, organic materials of this type that contain carbon, hydrogen and oxygen, preferably exclusively, may be employed. A suitable carboxylic acid useful as the expansion aid can be selected from aromatic, aliphatic or cycloaliphatic, straight chain or branched chain, saturated and unsaturated monocarboxylic acids, dicarboxylic acids and polycarboxylic acids which have at least 1 carbon atom, and preferably up to about 15 carbon atoms, which is soluble in the intercalation solution in amounts effective to provide a measurable improvement of one or more aspects of exfoliation. Suitable organic solvents can be employed to improve solubility of an organic expansion aid in the intercalation solution.

Representative examples of saturated aliphatic carboxylic acids are acids such as those of the formula $H(CH_2)_nCOOH$ wherein n is a number of from 0 to about 5, including formic, acetic, propionic, butyric, pentanoic, hexanoic, and the like. Sulfuric acid, nitric acid and other known aqueous intercalants have the ability to decompose formic acid, ultimately to water and carbon dioxide. Because of this, formic acid and other sensitive expansion aids are advantageously contacted with the graphite flake prior to immersion of the flake in aqueous intercalant. Representative of dicarboxylic acids are aliphatic dicarboxylic acids having 2–12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1,4-dicarboxylic acid and aromatic dicarboxylic acids such as phthalic acid or terephthalic acid. Representative of cycloaliphatic acids is cyclohexane carboxylic acid and of aromatic carboxylic acids are benzoic acid, naphthoic acid, anthranilic acid, p-aminobenzoic acid, o-, m- and p-tolyl acids, methoxy and ethoxybenzoic acids, acetoacetamidobenzoic acids and, acetamidobenzoic acids, phenylacetic acid and naphthoic acids.

The intercalation solution will be aqueous and will preferably contain an amount of carboxylic acid expansion aid of from about 0.2 to about 10%, the amount being effective to enhance exfoliation. In the embodiment wherein formic acid is contacted with the graphite flake prior to immersing in the aqueous intercalation solution, it can be admixed with the graphite by suitable means, such as a V-blender, typically in an amount of from about 0.2% to about 10% by weight of the graphite flake.

After intercalating the graphite flake, and following the blending of the intercalant coated intercalated graphite flake with the organic reducing agent, the blend is exposed to temperatures in the range of 25° to 125° C. to promote reaction of the reducing agent and intercalant coating. The heating period is up to about 20 hours, with shorter heating periods, e.g., at least about 10 minutes, for higher temperatures in the above-noted range. Times of one-half hour or less, e.g., on the order of 10 to 25 minutes, can be employed at the higher temperatures.

The thus treated particles of graphite are sometimes referred to as "particles of intercalated graphite." Upon exposure to high temperature, e.g. temperatures of at least about 160° C. and especially about 700° C. to 1000° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compressed together into flexible sheets that, unlike the original graphite flakes, can be formed and cut into various shapes and provided with small transverse openings by deforming mechanical impact as hereinafter described.

Flexible graphite sheet and foil are coherent, with good handling strength, and are suitably compressed, e.g. by roll-pressing, to a thickness of about 0.075 mm to 3.75 mm and a typical density of about 0.1 to 1.5 grams per cubic centimeter (g/cc). From about 1.5–30% by weight of ceramic additives can be blended with the intercalated graphite flakes as described in U.S. Pat. No. 5,902,762 (which is incorporated herein by reference) to provide enhanced resin impregnation in the final flexible graphite product. The additives include ceramic fiber particles having a length of about 0.15 to 1.5 millimeters. The width of the particles is suitably from about 0.04 to 0.004 mm. The ceramic fiber particles are non-reactive and non-adhering to graphite and are stable at temperatures up to about 1100° C., preferably about 1400° C. or higher. Suitable ceramic fiber particles are formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like.

Turning now to the drawings, a thermal management system prepared in accordance with the present invention is shown and generally designated by the reference numeral 10. It should be noted that for the sake of clarity not all the components and elements of system 10 may be shown and/or marked in all the drawings. Also, as used in this description, the terms "up," "down," "top," "bottom," etc. refer to thermal management system 10 when in the orientation shown in FIGS. 3, and 4. However, the skilled artisan will understand that thermal management system 10 can adopt any particular orientation when in use.

Thermal management system 10 is intended to be used to facilitate the dissipation of heat from a heat source, more particularly from an electronic component 100. Electronic component 100 can comprise any electronic device or component that produces sufficient heat to interfere with the operation of electronic component 100 or the system of which electronic component 100 is an element, if not dissipated. Electronic component 100 can comprise a microprocessor or computer chip, an integrated circuit, control electronics for an optical device like a laser or a field-effect transistor (FET), or components thereof, or other like electronic element. Electronic component 100 includes at least one surface 100a (denoted an "external surface") from which heat radiates and which can be used as a source of heat to be dissipated from electronic component 100.

Figure 2:
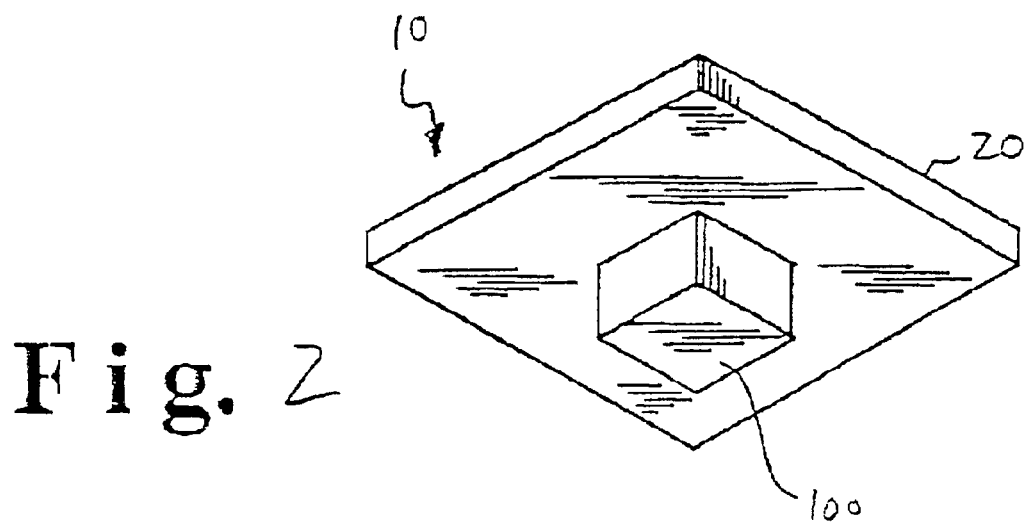
FIG. 2 is a bottom perspective view of the thermal management system of FIG. 1.
Figure 3:
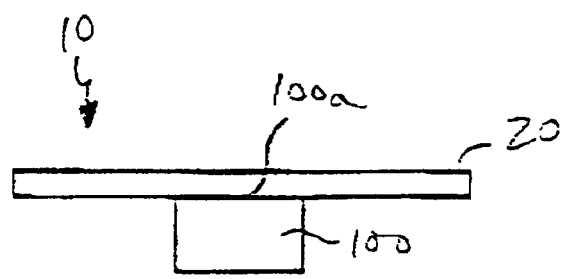
FIG. 3 is a side plan view of the thermal management system of FIG. 1.

Referring now to FIGS. 1, 2 and 3, the thermal management system 10 of the present invention includes a thermal interface 20. A principal function of thermal interface 20 is to form a sufficient operative connection with external surface 100a of electronic component 100 without the need for the exertion of undesirably high amounts of pressure. Depending on the nature of the other constituents of thermal management system 10, a second function of thermal interface 20 can be to increase the effective surface area of surface 100a of electronic component 100, to facilitate heat dissipation from electronic component 100. As stated above, efficient heat transfer (i.e., low thermal resistance) is important in the performance and life span of the electric component.

To that end, thermal interface 20 preferably comprises a flexible graphite sheet. By a flexible graphite sheet is meant a sheet of compressed, exfoliated graphite, especially natural graphite. Alternatively, the flexible graphite sheet can be produced by pyrolysis of a high-polymer film. As discussed above, graphite is a crystalline form of carbon comprising atoms covalently bonded in flat layered planes with weaker bonds between the planes. By treating particles of graphite, such as natural graphite flake, with an intercalant of, e.g. a solution of sulfuric and nitric acid, the crystal structure of the graphite reacts to form a compound of graphite and the intercalant. The treated particles of graphite are referred to as "particles of intercalated graphite." Upon exposure to high temperature, the particles of intercalated graphite expand in dimension as much as 80 or more times their original volume in an accordion-like fashion in the "c" direction, i.e. in the direction perpendicular to the crystalline planes of the graphite. The exfoliated graphite particles are vermiform in appearance, and are therefore commonly referred to as worms. The worms may be compressed together into flexible sheets which, unlike the original graphite flakes, can be formed and cut into various shapes.

Once the flexible graphite sheet is prepared as described, it can then be cut to size to form thermal interface 20. Depending on the application, a series of flexible graphite sheets of the desired dimensions can be laminated together to form a sandwich using a pressure sensitive adhesive, such as an acrylic adhesive, to form thermal interface 20, but it will be recognized that the more layers that are applied (with intervening adhesive), desirable thermal properties will be degraded. Preferably, therefore, thermal interface 20 comprises a single flexible graphite sheet.

The flexible graphite sheet that comprises the thermal interface of the claimed invention preferably has a thickness of about 0.05 mm to about 1.0 mm, more preferably from about 0.1 mm to about 0.5 mm. An example of a flexible graphite sheet that may be used in accordance with the present invention is available from Graftech Inc., Lakewood, Ohio under the tradename eGraf™. Another suitable flexible graphite sheet is a pyrolytic graphite sheet such as that available form Matsushita Electric Components Company Ltd., Ceramic Division, Japan under the tradename Panasonic PGS®.

An advantage of the use of thermal interface 20 of the present invention is in its conformability. Since external surface 100*a* of electronic component 100 is generally formed of a metallic or ceramic material, or other like material, the surface of external surface 100*a* is not perfectly smooth (even though it may appear so to the naked eye, or to the touch), but is rather covered by surface deformations and irregularities, or "peaks and valleys." This causes air gaps (which act as thermal insulators between the surfaces of the thermal interface and the heat sink and/or the heat source.

Because of these deformations, achieving a firm thermal connection with a metallic (such as copper) or other type of heat sink (such as a graphite heat sink), which also has surface deformations is difficult without exerting a great deal of pressure to make the thermal connection.

In the past, pressures well in excess of 50 pounds per square inch (psi) were often needed for metal to metal connections between the heat sink and the heat source. Such pressures have the potential to damage electronic component 100.

To remedy this problem, the thermal interface of the present invention may be used. The thermal interface of the present invention comprises a flexible graphite sheet that contains oil. The oil/graphite sheet combination improves conformability and, therefore lowers the thermal resistance. Without being bound by theory, the oil can replace the air present where the respective parts communicate. Additionally, the oil makes the graphite sheet "softer" and more amenable to surface deformations and irregularities of the heat source/cooling module.

The oil used in the present invention includes a wide range of substances including, for example, mineral oil, vegetable oil, animal oil, essential oil, edible oil, synthetic oil like silicon oil, and combinations thereof. The mineral oil for use in the present invention includes, for example, paraffinic mineral oils, naphthenic mineral oils, intermediate-based mineral oils, etc. The mineral oils for use in the present invention are typically petroleum based and include aliphatic, aromatic, and mixed-base oils. Specific examples of mineral oils for use in the present invention include neutral oils, medium-gravity neutral oils, heavy neutral oils, bright stocks, and common lubricants such as engine oil, and medicinal oil such as refined paraffin oil. The vegetable oil used in connection with the present invention may be chiefly derived from seeds or nuts and includes rapeseed, oil, canola oil, soybean oil, corn oil, cottonseed oil, linseed oil, olive oil, tung oil, peanut oil, meadowfoam oil, sunflower oil, soybean oil, safflower oil, jojoba oil, palm oil, castor oil, coconut oil, etc. Vegetable based oil can be obtained, for example, from a genetically modified plant or be modified by water washing, refining, esterification, hydrolysis, etc. The animal oil used in connection with the present invention include fish oils, fish-liver oils, oleic acid, etc. The essential oils used in connection with the present invention include liquids derived from flowers, stems, and leaves, and often the entire plant. These oils may include oil typically used in cosmetics. Additionally, traditional edible oils may be used in connection with the present invention. These oils are derived from fruits, or seeds and plants. Most common are corn, coconut, soybean, olive, cottonseed, and safflower. These oils have varying degrees of saturation. Finally, synthetics oils may be used in connection with the present invention. The synthetic oils are ester type oils, polyalfaolefin oligomers or alkylated benzenes.

The primary requirements with respect to the oil used in the present invention include having a liquid consistency at room temperature so that the oil may be absorbed by the graphite sheet, and higher thermal conductivity than the air present in the pores of the graphite sheets. In its broadest sense the oil used in the present invention may be any liquid that has a higher thermal conductivity than air and can be absorbed by the graphite sheet.

Preferably, the oil used in conjunction with the invention has a viscosity of from about 1 to about 400 centipoises (cps) at 37.8° C., more preferably from about 2 to about 200 cps, and more preferably from about 10 to about 50 cps.

Preferably, the oil is present in the graphite sheet in an amount of from about 2% to about 75% by weight, more preferably from about 10% to about 55% by weight, and most preferably from about 15% to about 40% by weight. In a preferred embodiment, the oil is added to the extent where the pores of the graphite sheet are substantially filled with oil. In other words, the air present in the pores is replaced with the oil as it is absorbed into the graphite sheet. Therefore, the percent by weight of the oil present in the graphite sheet may change due to different graphite sheets having a different volume of pores and different oils having a different weight.

Preferably, the oil may be applied to the graphite sheet by spraying, dipping, immersion or any other suitable technique. The surface of the sheet absorbs the oil, resulting in a surface which preferably does not evidence an "oily" feel or texture.

Since thermal interface 20 of the present invention is more conformable to the surface topography of external surface 100*a* of electronic component 100 as well as to a heat sink, a better thermal connection between electronic component 100 and a heat sink having surface deformations can be achieved.

The thermal interface 20 of the present invention can be adhered or mounted to external surface 100*a* of electronic component 100 by several methods. For instance, a thin layer of a pressure sensitive thermally activated adhesive can be used to mount thermal interface 20 to electronic component 100. Alternatively, when a heat sink is being employed, thermal interface 20 can be "sandwiched" between the heat sink and electronic component 100. The skilled artisan will recognize other, equally effective, ways to adhere or mount thermal interface 20 to electronic component 100.

Figure 4:
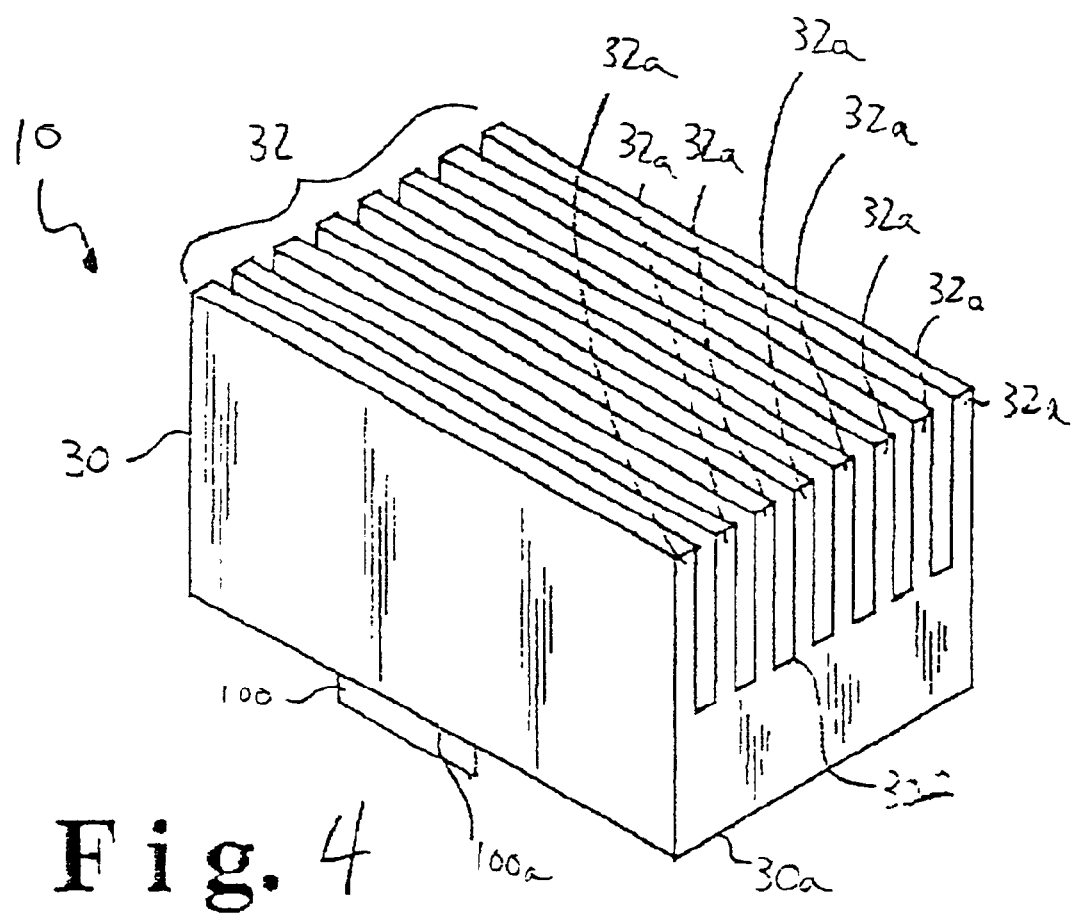
FIG. 4 is a top perspective view of another embodiment of a thermal management system in accordance with the present invention.

Referring now to FIG. 4, thermal management system 10 of the present invention preferably also comprises a heat sink 30 article shaped so as to provide a heat collection surface 30a and at least one heat dissipation surface 32. When heat collection surface 30a of heat sink 30 is in operative connection with a heat source, i.e., external surface 100a of electronic component 100, heat is dissipated from external surface 100a through the at least one heat dissipation surface 32 of heat sink 30.

Heat dissipation surface as used herein refers to an area of heat sink 30 from which the heat transmitted to heat sink 30 from external surface 100a (through thermal interface 20 when present) is dissipated into the environment. Most commonly, the at least one heat dissipation surface 32 of heat sink 30 are those surfaces of heat sink 30 where air or another coolant fluid is passed across heat sink 30 such as by the action of a fan (not shown). To maximize heat transfer from heat sink 30 to the coolant fluid, the at least one heat dissipation surface 32 of heat sink 30 should be designed and/or shaped so as to have as great a surface area as feasible.

For instance, and as illustrated in FIG. 4, the at least one heat dissipation surface 32 of heat sink 30 comprises fins 32a formed at a surface of heat sink 30 opposite heat collection surface 30a, such that heat travels from heat collection surface 30a to fins 32a, where air or other coolant passing across fins 32a can absorb the heat from fins 32a and thereby carry it away (and, by extension, away from electronic component 100). The number and size and shape of fins 32a can be chosen by the practitioner to achieve a balance between coolant flow and surface area. For instance, more fins 32a, each of which is thinner with less space therebetween, will provide increased surface area, but may interfere with coolant flow; likewise, fewer, larger fins 32a, with greater space therebetween will result in greater thermal convection efficiency but less surface area.

The following example is presented to farther illustrate the present invention, and are not intended to limit the present invention in any way.

EXAMPLE

A thermal interface material, produced by exfoliating an intercalated natural graphite flake, is compressed and rolled to a thickness of 0.254 mm. The thermal properties of the material are measured at a contact pressure of 16 psi. The thermal contact resistance is 1.09 cm$^2$ K./W and the thermal conductivity is 5.2 W/m°K. The thermal interface material is then uniformly coated with light mineral oil and the oil is allowed to soak into the interface material. The weight pickup of the oil by the sheet is 50% by weight. The thermal contact resistance of this material is reduced to 0.79 cm$^{2o}$K./W (a 28% improvement) and the thermal conductivity is increased to 6.13 W/m°K. (a 18% improvement).

All cited patents and publications referred to in this application are incorporated by reference.

The invention thus being described, it will be obvious that it may be varied in many ways. Such variations are not to be regarded as a departure from the spirit and scope of the present invention and all such modifications as would be obvious to one skilled in the art are intended to be included within the scope of the following claims.

What is claimed is:

1. A thermal management system, comprising:
   (1) a heat source having an external surface;
   (2) a thermal interface which comprises an anisotropic flexible graphite sheet article that contains oil, the thermal interface being in operative communication with the external surface of the heat source; and
   (3) a heat dissipating component having a heat collection surface and a heat dissipation surface, the heat collection surface being in operative communication with the thermal interface;
   wherein arranging the heat collection surface in operative connection with the thermal interface causes dissipation of heat form the heat source.

2. The thermal management system of claim 1, wherein the oil is mineral oil, vegetable oil, synthetic oil, edible oil, edible oil, animal oil, and mixtures thereof.

3. The thermal interface material of claim 1, wherein the oil is mineral oil.

4. The thermal management system of claim 1, wherein the heat source is an electronic component.

5. The thermal management system of claim 1, wherein the planar area of the thermal interface is greater than the area of the external surface of the heat source.

6. The thermal management system of claim 1 wherein the flexible graphite sheet article is formed by compressing exfoliated particles of natural graphite.

7. The thermal management system of claim 1 wherein the thermal interface material has a thickness of from about 0.05 mm to about 1.0 mm.

8. The thermal management system of claim 1, wherein the oil comprises ester type oil.

9. The thermal management system of claim 1, wherein the nil comprises a polyalfaolefin oligomer.

10. The thermal management system of claim 1, wherein the oil comprises an alkylated benzene.

11. The thermal management system of claim 1 wherein the thermal interface comprises a laminate of flexible graphite sheets.

12. A thermal management system comprising;
   (a) a beat source which comprises an electronic component, the heat source having an external surface;
   (b) a thermal interface comprising an anisotropic flexible graphite sheet article having two parallel planar surfaces extending in a direction parallel to the planar direction of the crystal structure of the graphite in the sheet, the first of the planar surfaces of the thermal interface being in operative contact with the external surface of the heat source; wherein the graphite sheet comprises at least 2% by weight of mineral oil, and wherein the planar area of the first planar surface for the thermal interface is greater than the area of the external surface of the heat source; and
   (c) a heat sink comprising a heat collection surface and at least one heat dissipation surface, the heat collection surface of the heat sink being in operative contact with the second of the planar surfaces of the thermal interface.

13. The thermal management system of claim 12 wherein graphite sheet comprises about 2% to about 75% by weight of mineral oil.

14. The thermal management system of claim 12 wherein graphite sheet comprises about 10% to about 55% by weight of mineral oil.

15. The thermal management system of claim 12, wherein the mineral oil has a viscosity of from about 10 to 50 cps.

16. The thermal management system of claim 12 wherein the thermal interface comprises a laminate of flexible graphite sheets.

17. A method of dissipating heat from a heat source, comprising:
 (a) providing an heat sink, and providing a thermal interface, the thermal interface comprising an anisotropic flexible graphite sheet article having first and second parallel planar surfaces and having about 2% to about 75% by weight of mineral oil incorporated into the graphite sheet;
 (b) placing the first parallel surface of the thermal interface in heat conducting engagement with a heat source, and placing the second parallel surface of the thermal interface in heat conducting engagement with the heat sink; and
 (c) conducting heat from the heat source through the thermal interface and into the beat sink.

18. The thermal management system of claim 17 wherein the thermal interface comprises a laminate of flexible graphite sheets.

19. A thermal management system, comprising:
 (1) a heat source having an external surface; and
 (2) a thermal interface which comprise an anisotropic flexible graphite sheet that contains oil, the thermal interface being in operative communication with the external surface of the heat source.

20. The thermal management system of claim 19, wherein the oil is mineral oil, vegetable oil, synthetic oil, essential oil, edible oil, animal oil, and mixtures thereof.

21. The thermal interface material of claim 19, wherein the oil is mineral oil.

22. The thermal management system of claim 19, wherein the heat source is an electronic component.

23. The thermal management system of claim 19, wherein the planar area of the thermal interface is greater than the area of the external surface of the heat source.

24. The thermal management system of claim 19 wherein the flexible graphite sheet is farmed by compressing exfoliated particles of natural graphite.

25. The thermal management system of claim 19 wherein the thermal interface material has a thickness of from about 0.05 mm to about 1.0 mm.

26. The thermal management system of claim 19 wherein the thermal interface comprises a laminate of flexible graphite sheets.

* * * * *